United States Patent

[11] 3,590,330

[72] Inventors Wladimiro Teagno; Leonardo Santini, both of Turin, Italy
[21] Appl No. 828,919
[22] Filed May 29, 1969
[45] Patented June 29, 1971
[73] Assignee AMP Incorporated Harrisburg, Pa.
[32] Priority May 21, 1968
[33] Italy
[31] 1,723/A/68

[54] FUSED PRINTED CIRCUIT BOARD INTERCONNECTOR
7 Claims, 12 Drawing Figs.

[52] U.S. Cl. .......... 317/101, 317/114, 317/116, 339/17
[51] Int. Cl. .......... H05k 1/04
[50] Field of Search .......... 317/101 DH, 101 CC, 101 D, 116, 114; 339/176 M, 176 MP, 17 M, 17 C, 17 LM

[56] References Cited
UNITED STATES PATENTS
2,841,660 7/1958 Tabet .......... 339/17 LM (UX)
3,176,261 3/1965 Greco et al. .......... 339/17 LM (UX)
3,184,650 5/1965 Ecker .......... 339/17 LM (UX)
3,341,745 9/1967 Munro .......... 317/116
FOREIGN PATENTS
819943 9/1959 Great Britain .......... 317/116

*Primary Examiner*—David Smith, Jr.
*Attorneys*—Curtis, Morris and Safford, William J. Keating, William Hintze, Frederick W. Raring, John R. Hopkins, Adrian J. LaRue and Jay L. Seitchik

ABSTRACT: A two-part box shell contains a stack of spaced printed circuit boards interconnected at one side of the box by comb-contacts which project above the stack for interconnection by fuses accessible through a cover. Other sides of the box are apertured for receiving multicontact edge connectors engaging the boards of the stack. Harness wires in groups are interconnected through the circuit boards and the fuses in circuit paths determined by the printed circuit patterns which can be changed, for example, to adapt the device to the requirements of specific automobile wiring systems.

INVENTORS
WLADIMIRO TEAGNO
LEONARDO SANTINI
BY Adrian J. La Rue

INVENTORS

WLADIMIRO TEAGNO

LEONARDO SANTINI

BY Adrian J. LaRue

INVENTORS
WLADIMIRO TEAGNO
LEONARDO SANTINI

BY Adrian J. La Rue

INVENTORS

WLADIMIRO TEAGNO

LEONARDO SANTINI

BY Adrian J. LaRue

INVENTORS
WLADIMIRO TEAGNO
LEONARDO SANTINI

BY Adrian J. La Rue

FUSED PRINTED CIRCUIT BOARD INTERCONNECTOR

This invention relates to circuit junction blocks for interconnection of a plurality of circuit conductors in a predetermined circuit pattern. The invention is usefully applicable, for example, as a junction block in an automotive wiring harness.

It has previously been proposed to provide a fused junction block for automotive harness wiring comprising a panel for bulkhead mounting provided with a plurality of connector-receiving cavities each containing a plurality of contacts connected to harness wiring. The panel additionally contained a plurality of fuses with fuses interconnected to the contacts by jumper wires. Connectors for insertion in the connector-receiving cavities were provided with contacts connected to further harness wiring so that insertion of a connector interconnected the further wiring circuits containing the fuses. This arrangement presents difficulty where large numbers of wires require to be interconnected or variation in the predetermined interconnection is required.

A circuit junction block for interconnecting a plurality of circuit conductors in a predetermined circuit pattern according to the present invention comprises a plurality of circuit boards mounted in a frame in generally parallel spaced relationship, each circuit board having circuit paths on at least one side, the frame having an aperture at which edge portions of the boards are exposed, terminal portions of the circuit paths being disposed at the exposed edge portions of the boards, the aperture being arranged to receive a connector having a plurality of edge contacts, connected to respective circuit conductors and engageable with edges of respective boards for electrically connecting with the terminal portions of the circuit paths, selected circuit paths of different boards being interconnected by transverse conductors extending transversely of the circuit boards.

Suitably the conductors extending transversely of the stack of boards are interconnected in pairs or groups through functional electrical components. In one embodiment the transversely extending conductors are of comblike form having a plurality of fork contacts engaging respective boards of the stack and projecting above the stack of boards, the projecting portion connecting with a receptacle for releasably engaging an end of a fuse element or other functional component, receptacles associated with adjacent transverse conductors being arranged releasably to receive a fuse element or functional component between them.

An object of the invention is to provide a circuit junction block carrying parallel-spaced printed circuit boards and connector strips in the block connecting circuit paths on the printed circuit boards together.

Another object is the provision of fuse connectors in the circuit junction block to provide fused circuits.

A further object is to provide connectors connected to working harness means with the connectors being removably connected to the circuit junction block so that terminals in the connectors can be connected to the circuit paths on the printed circuit boards.

An additional object is the provision of a segmented circuit junction block which is provided with interengaging segments to complete selected circuits for any electrically operated element.

Other objects and attainments of the present invention will become apparent to those skilled in the art upon a reading of the following detailed description when taken in conjunction with the drawings in which there is shown and described an illustrative embodiment of the invention; it is to be understood, however, that this embodiment is not intended to be exhaustive nor limiting of the invention but is given for purposes of illustration in order that others skilled in the art may fully understand the invention and the principles thereof and the manner of applying it in practical use so that they may modify it in various forms, each as may be best suited to the conditions of a particular use.

The invention will now be described by way of example with reference to the accompanying partly diagrammatic drawings, in which.

Figure 1:
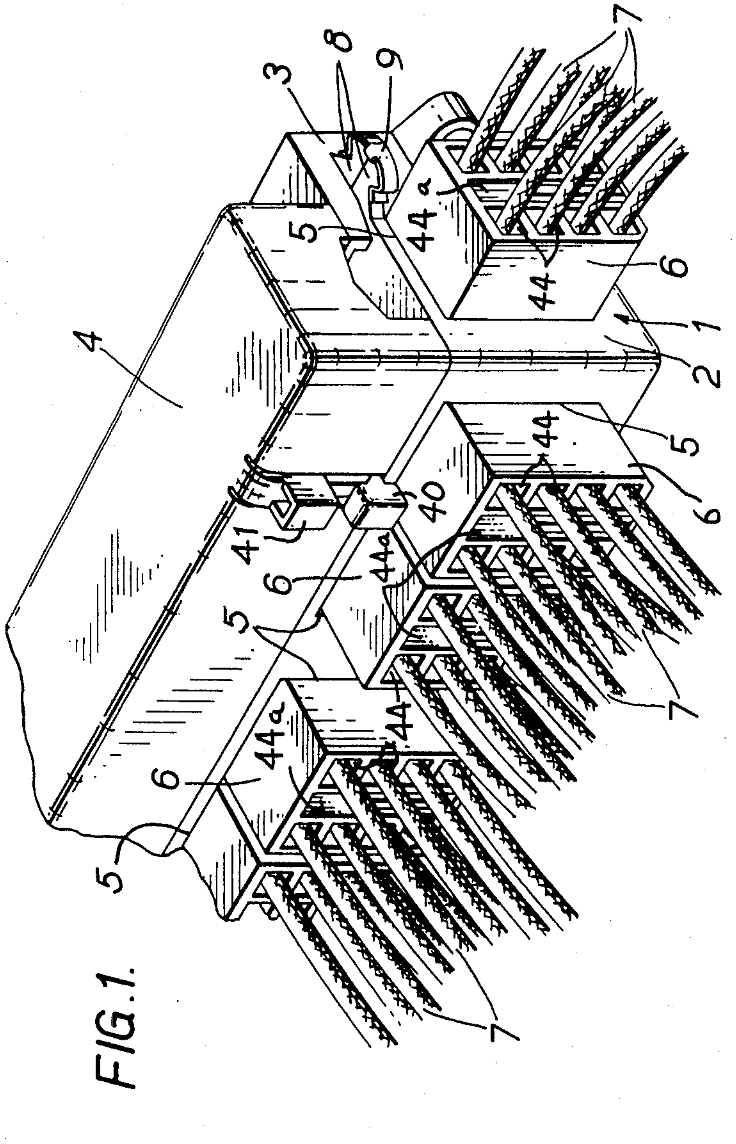
FIG. 1 is a fragmentary perspective view of a junction block according to the present invention.
Figures 2, 2A:
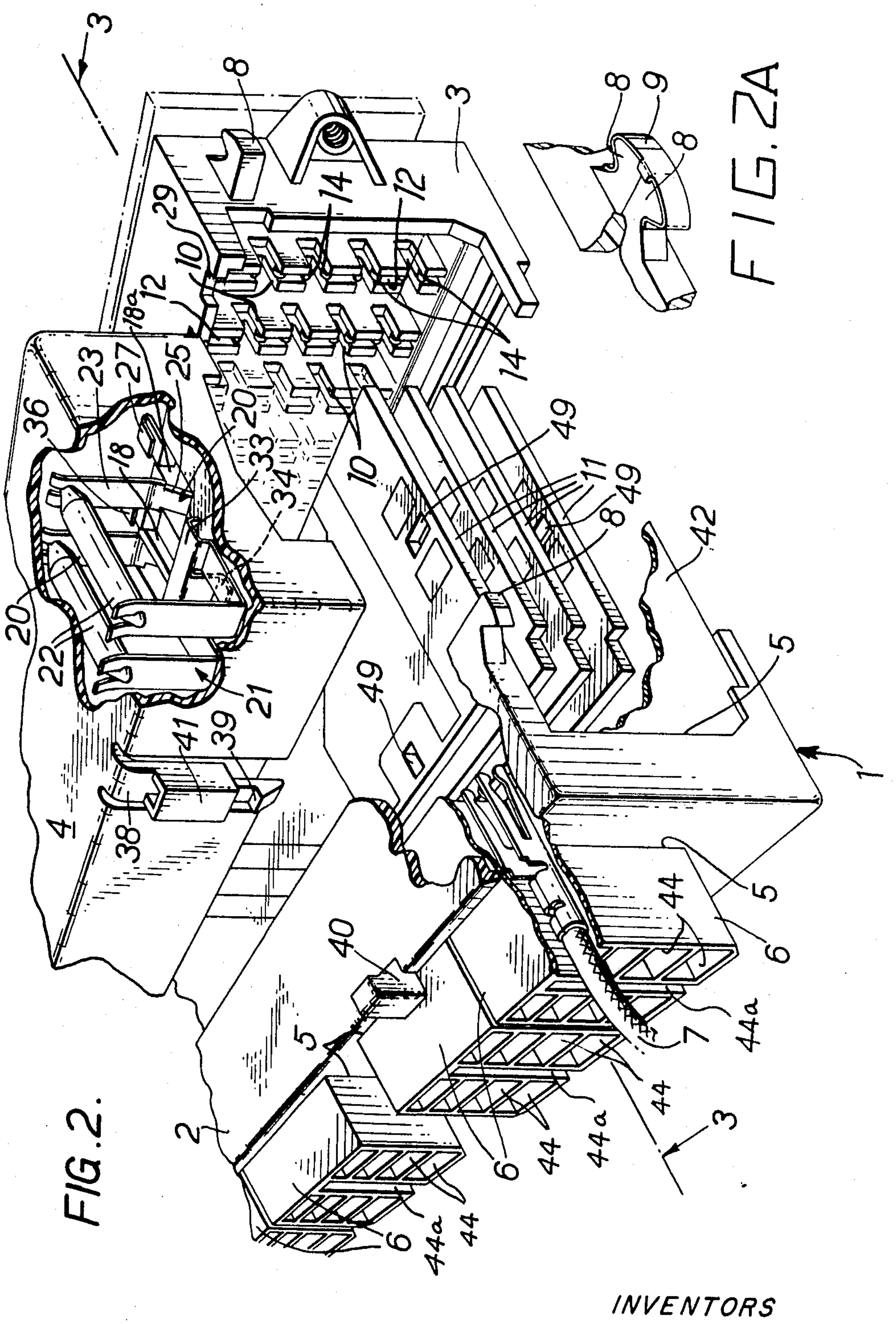
FIG. 2 is a fragmentary, partly exploded view of the assembly of FIG. 1.
Figure 3:
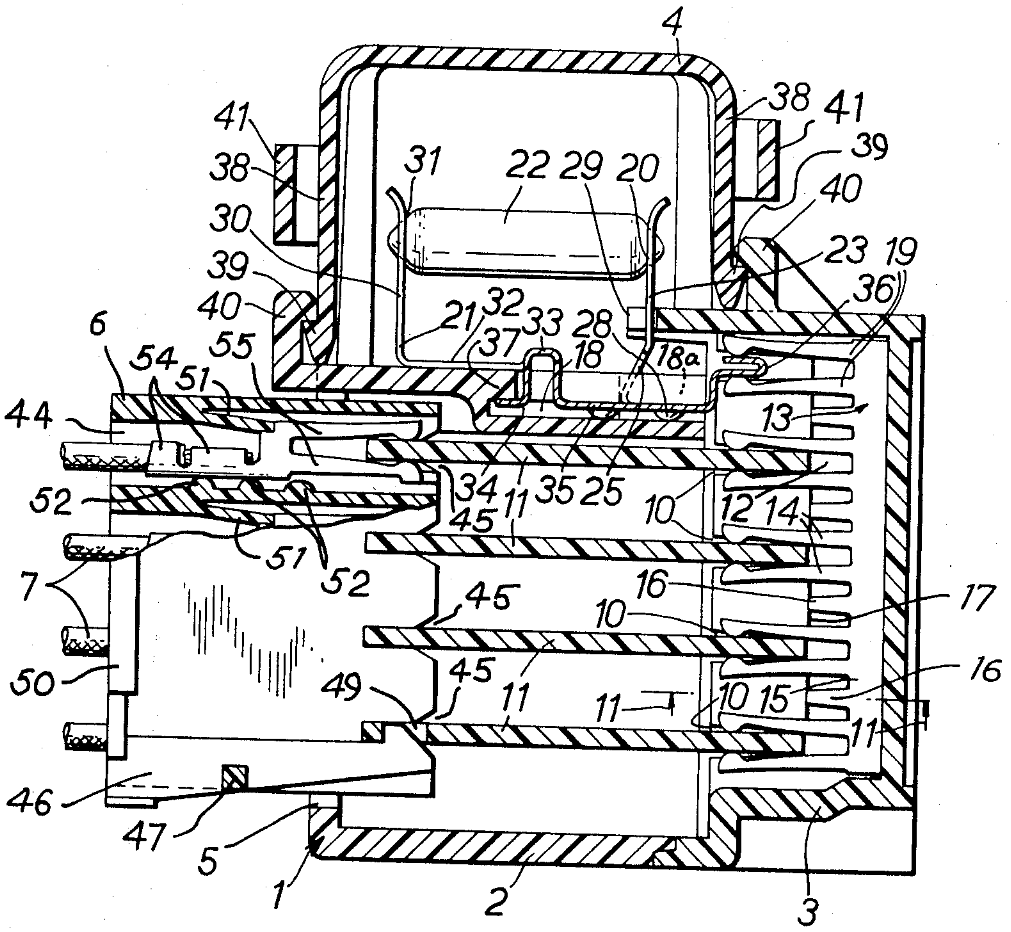
Figure 4:
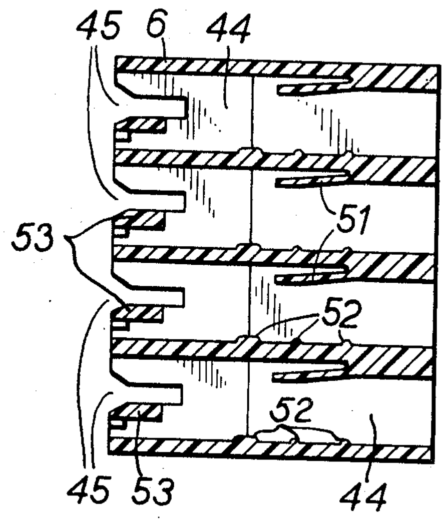
Figure 5:
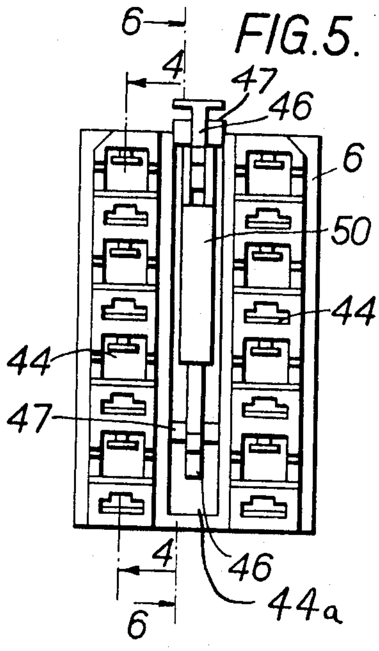
Figure 6:
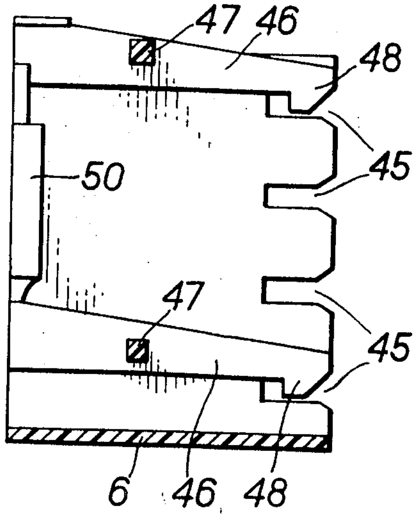
Figure 7:
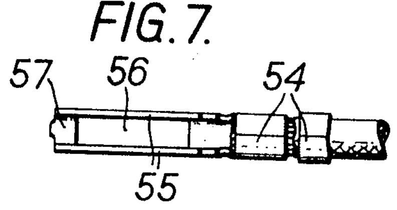
Figure 8:
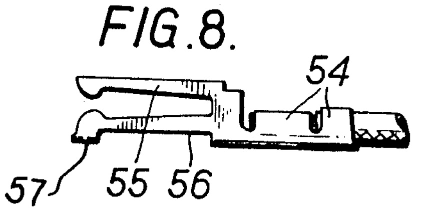
Figure 9:
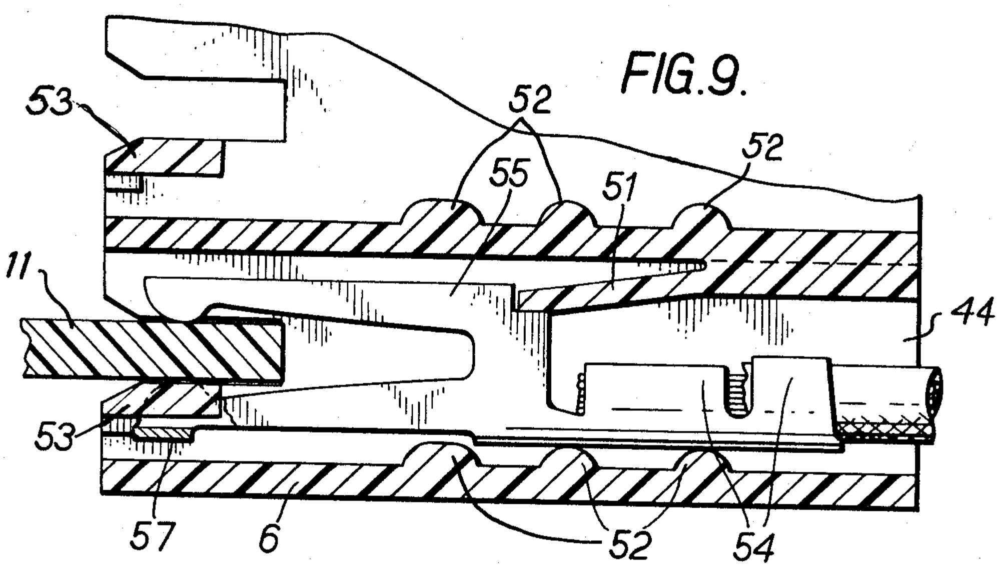
Figure 10:
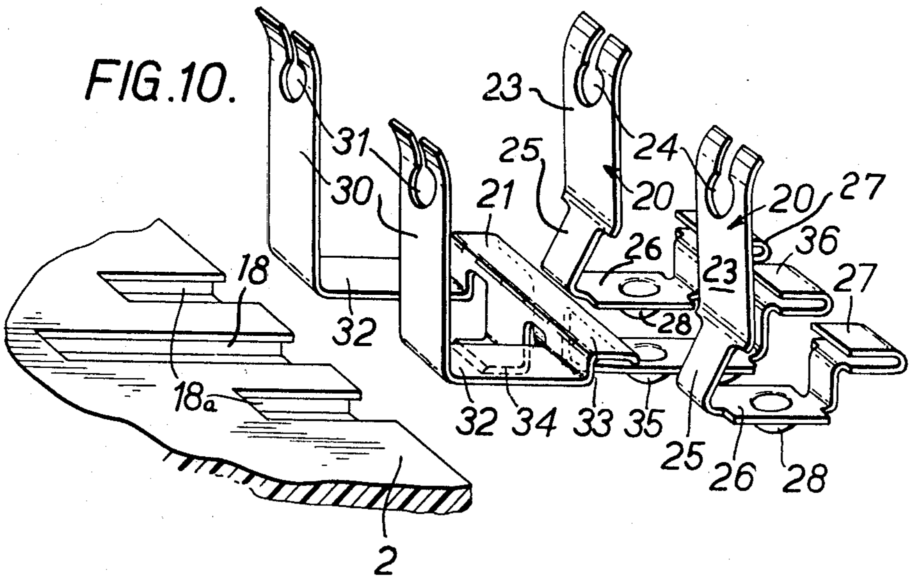
Figure 11:
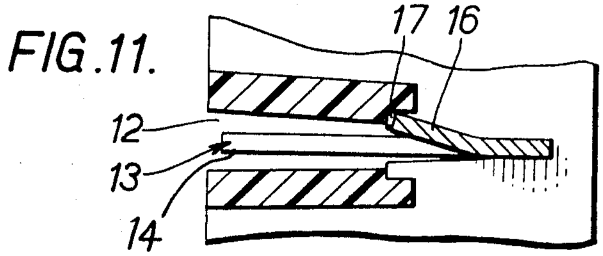

FIG. 2*a* is a fragmentary perspective view of clamping means for clamping parts of the block together;

FIG. 3 is a section of line 3–3 of FIG. 2 of the block in assembled condition;

FIG. 4 is a sectional side elevational view of a connector block of the assembly of FIGS. 1 to 3 and taken on the line 4–4 of FIG. 5;

FIG. 5 is a rear end view of the connector block of FIG. 4;

FIG. 6 is a sectional elevational view taken on the line 6–6 of FIG. 5 of the connector block;

FIG. 7 is a plan view of a contact for the connector block of FIGS. 5 to 7;

FIG. 8 is a side elevational view of the contact of FIG. 7;

FIG. 9 is a fragmentary sectional view of part of the connector block of FIGS. 4 to 6 with the contact of FIGS. 7 and 8 mounted in position and in engagement with the edge of a printed circuit board;

FIG. 10 is a fragmentary exploded view of part of the assembly of FIG. 1 illustrating the fuse contacts; and FIG. 11 is a fragmentary sectional view taken on line 11–11 of FIG. 3.

The junction block of FIGS. 1 to 3 comprises a generally rectangular box or housing 1 of insulating material formed in two shell halves 2 and 3 releasably secured together. The box 1 is provided with a removable upper lid 4 defining a fuse cover and on one side and both ends the box is formed with connector-receiving apertures 5, each releasably receiving a multiple contact electrical connector 6 containing contacts secured to harness wiring 7. The half shells 2 and 3 are formed with lugs 8 clamped together by spring fasteners 9 for holding the box in assembled condition, the box 1 being formed internally with lateral grooves 10 and containing a stack of printed circuit boards 11 mounted in the grooves 10 and held in parallel spaced relationship.

The rear half shell 3 of the box 1 is formed with a plurality of upright slots 12 spaced longitudinally of the box and each slot 12 containing a comblike contact strip 13. Each comblike contact strip 13 comprises a series of fork contacts 14 integrally formed on a carrier strip 15 and having latch detents 16 disposed between the fork contacts engaging a shoulder 17 in the associated slot 12 to hold the contact strip in position. The fork contacts project into the slots 10 at the rear of rear shell half 3 and engage edges of respective printed circuit boards 11 to contact appropriate conductive strips of the boards 11.

The forward half shell 2 is formed on its upper side with slotlike recesses 18, seen in FIG. 3, spaced along the upper side of shell 2 and disposed adjacent the rear half shell 3. Alternate groovelike recesses 18*a* are shorter than intermediate recesses 18, as seen in FIG. 10, and the upper side of the rear half shell 3 projects above the floor of the recesses 18 and 18*a* as seen in FIG. 3, to expose upper contact forks 19 of the comblike contact strips 13 to the groovelike recesses 18 and 18*a* for engaging tab ends of fuse contacts 20 and 21 located in the recesses 18 and 18*a*. The fuse contacts project upwardly within the lid or cover 4 where they releasably receive cartridge fuses 22 between them.

As seen in FIGS. 2, 3 and 10, alternate fuse contacts 20 are differently formed from intermediate contacts 21. Each contact 20 comprises an upright tab 23 formed with a slotted aperture 24 for engaging an end of a fuse cartridge 22, as shown in FIGS. 2 and 3, or alternatively the edge of a printed circuit fuse (not shown). The tab 23 at its lower end is inclined downwardly and forwardly away from the associated contact strips 13 at 25, and then rearwardly as a platform 26. The rear end of the platform 26 is bent up and then rearwardly at 27 in hairpin manner to define a lateral tab of more than twice the metal thickness. The platform 26 is formed with a downwardly convex dimple 28 and the contact is mounted by engaging the hairpin tab 27 in the associated upper fork contact 19, the platform dimple 28 being supported on the floor of one of the shorter groovelike recesses 18*a*, the bight between the platform and the inclined portion 25 engaging the closed end of the groovelike recess 18*a*, and the tab 23 extending upwardly through an open-ended slot 29 in the upper forward edge of the rear shell 3.

Each contact 21 comprises a pair of upright tabs 30 each formed at its upper free end with a slotted aperture 31 for receiving an end of a cartridge fuse 22, as shown or a printed circuit fuse (not shown). Lower ends of the tabs 30 are bent rearwardly to define platforms 32 which are integrally formed with a bridge portion 33 common to the two tabs and from which a foot 34 projects downwardly and forwardly between the platforms 32. An integral dimpled platform 35 extends below and rearwardly of the bridge 33 and at its rear end is bent up and then rearwardly in hairpin fashion to define a hairpin tab 36. In assembly the tab 36 engages the associated fork contact 19, the dimpled platform 35 is supported on the floor of one of the longer groovelike recesses 18 with the foot 34 engaging below a lip 37 at the closed end of the groovelike recess 18. The platform 32 engages the upper surface of shell half 2 to the side of the groovelike recesses 18 and the tabs 30 project upwardly opposite respective tabs 23 of the adjacent fuse contacts 20. A fuse cartridge 22 is clamped between opposed tabs 30 and 23 with its ends engaging the apertures 31 and 24. Each fuse contact 21 is associated with a pair of fuses engaging respective contacts 20 and thus the comblike contact strip 13 associated with a fuse contact 21 is interconnected through fuses to the pair of adjacent comblike contact strips.

The groovelike recesses 18 and 18*a*, which are formed as a series of slots in the upper rear edge of the forward shell half 2, serve to stabilize the fuse contacts in the assembly. The lid or cover 4 is formed at opposite sides with resilient latch arms 38 having lower heads 39 which engage shouldered lugs 40 formed at the upper sides of shell halves 2 and 3 for releasably securing the lid 4 in position. The arms 38 have finger grip projections 41 for release of the heads 39 from the lugs 40 by inwards pressure.

The connector blocks 6 for the various connector-receiving apertures 5 of the box 1 are suitably of similar form but may be polarized in relation to the various apertures. Where use of all of the apertures 5 is not required, the end apertures of the box may be blanked off by insulating plates 42 disposed within the housing during assembly, generally as shown in FIG. 2. Each connector block 6, as shown in FIGS. 4 to 6 comprises a molding of resilient insulating material having two upright rows of contact passageways 44. The connector is laterally slotted at its leading end by a series of slots 45 communicating with pairs of passageways 44 for receiving edges of the printed circuit boards 11 exposed at the associated connector-receiving apertures 5. At a central region between the upright rows of passageways 44, the connector block is provided with a slot 44*a* and the slot contains a pair of latch arms 46 integrally formed with central pivots 47 supporting them in the slot. The arms 46 at their leading ends are formed with heads 48 for latching engagement with apertures 49 formed at appropriate locations in the upper and lower printed circuit boards 11 of the stack. To this end the heads 48 project into the upper and lower slots 45 of the block. The arms 46 at their outer ends are integrally joined by a bar 50 for simultaneous operation by a finger grip exposed at an open side of the slot.

Each passageway 44 is formed in its upper side, as seen in FIG. 4, with an integral forwardly and downwardly inclined resilient latch detent 51. On the lower side opposite the detent, the passageway 44 is formed with a series of ridges 52. The passageway at its forward end below the slot 45 is bridged by a bar 53 spaced above the floor. A contact for insertion into a passageway 44 is as shown in FIGS. 7 and 8 and comprises a generally channel-shaped contact having a crimping section 54 at its rear end secured to a harness wire. Sides 55 of the channel are forked and the base of the channel is apertured between the sides 55 at 56 rearwardly of a forward base portion 57. The contact is secured in the passageway as seen in FIG. 9, by forward insertion past the latch detent 51 which engages behind the forked sides 55. The forward base portion engages under the bar portion 53, and the crimping section 54 is supported on the ribs 52.

The printed circuit boards 11 are provided with conductive paths arranged to present edge contacts for engagement at one side by the comblike contact strips 13 and at the other side or at ends of the box by contacts of the connector blocks 6. The board conductors are arranged to effect desired connection between different harness contacts of the blocks 6 through the circuit board conductors and the contact combs and the fuses 22. By use of different circuit boards, the assembly may be adapted to effect interconnection of the wiring of harnesses of different automobiles.

Although the invention has been described with reference to the interconnection of circuit conductor 7 of conventional wire form, it can equally well be used, for example with circuit conductors of flat-tape cable form in which a plurality of conductive strips are positioned in side-by-side spaced relationship in a flexible insulating lamina or tape. In such a case, the connector blocks 6 are adapted to receive the ends of several tape cables, and each tape cable is terminated by a series of edge contacts secured to the tape and to respective conductive strips of the tape.

It will, therefore, be appreciated that the aforementioned and other desirable objects have been achieved; however, it should be emphasized that the particular embodiment of the invention, which is shown and described herein, is intended as merely illustrative and not as restrictive of the invention.

The invention we claim in accordance with the following:

1. A circuit junction block for interconnecting a plurality of circuit conductors in a predetermined circuit pattern, a plurality of circuit boards 11 mounted in a frame 2, 3 in generally parallel spaced relationship, the frame being formed as a generally rectanguloid box containing the circuit boards, each circuit board 11 having circuit paths on at least one side, the sides of the box having apertures 5 at which edge portions of the boards 11 are exposed, terminal portions of the circuit paths being disposed at the exposed edge portions of the boards, the apertures 5 being arranged to receive respective multiple contact edge connectors 6 having a plurality of edge contacts 55, connected to respective circuit conductors 7 and engageable with edges of respective boards 11 for electrically connecting with the terminal portions of the circuit paths, selected circuit paths of different boards being interconnected by transverse conductors 13, 14 extending transversely of the circuit boards 11.

2. A junction block as claimed in claim 1, characterized in that the transversely extending conductors 13, 14 are interconnected in pairs or groups through functional electrical components 22.

3. A junction block as claimed in claim 1 characterized in that the transversely extending conductors 13, 14 comprise comblike contact strips, each provided with a series of contact forks 14 engaging edges of respective circuit boards 11.

4. A junction block as claimed in claim 3, characterized in that each contact strip 13,14 projects above the stack of boards 11 and the projecting contact portions 19 of adjacent strips are interconnected through fuse elements 22 or other functional electrical components.

5. A junction block as claimed in claim 4, characterized in that the projecting portions 19 of the contact strips 13,14 are each formed with an additional contact fork 19 the additional contact fork engaging an end of a contact tab 27,36 extending generally parallel to the boards 11, the contact tabs being bent up at ends 20,30 remote from the contact strips 13,14 the bent up portions 30 of alternate contact tabs being disposed further from the contact strips 13,14 than the bent up portions 20 of intermediate tabs, the functional electrical components 22 being releasably gripped between the bent up portions 20,30 of intermediate and alternate contact tabs.

6. A junction block as claimed in claim 1, characterized in that at each aperture 5 in the box, at least one of the boards 11 is provided with a hole 49 for engaging a latch device 48 of a connector 6.

7. A junction block as claimed in claim 1, characterized in that the transversely extending conductors 13,14 extend into a compartment containing functional components 22 interconnecting selected transversely extending conductors 13,14, the compartment having an openable lid 4 for access to the functional components 22.